US006279527B1

United States Patent
Glovatsky et al.

(10) Patent No.: US 6,279,527 B1
(45) Date of Patent: Aug. 28, 2001

(54) APPARATUS FOR ROUTING ELECTRICAL SIGNALS IN AN ENGINE

(75) Inventors: Andrew Z. Glovatsky, Livonia; Myron Lemecha, Dearborn; Mark Miller, Monroe; Jay DeAvis Baker, West Bloomfield, all of MI (US)

(73) Assignee: Visteon Global Tech., Inc., Dearborn, MI (US)

( * ) Notice: Subject to any disclaimer, the term of this patent is extended or adjusted under 35 U.S.C. 154(b) by 0 days.

(21) Appl. No.: 09/690,969

(22) Filed: Oct. 17, 2000

Related U.S. Application Data

(62) Division of application No. 08/999,077, filed on Dec. 29, 1997.

(51) Int. Cl.$^7$ .............................. F02P 23/00; F02M 35/10
(52) U.S. Cl. .................................. 123/143 C; 123/184.61
(58) Field of Search .......................... 123/143 C, 184.61, 123/456; 174/19, 17 R, 24, 31 S

(56) References Cited

U.S. PATENT DOCUMENTS

| | | | |
|---|---|---|---|
| 2,234,579 | * 3/1941 | Robertson | 123/148 |
| 4,050,093 | * 9/1977 | Crall et al. | 361/383 |
| 4,951,878 | * 8/1990 | Casey et al. | 239/462 |
| 5,129,834 | * 7/1992 | Cranford | 123/456 |
| 5,203,292 | * 4/1993 | Motose | 123/143 C |
| 5,353,758 | * 10/1994 | Masuda et al. | 123/143 C |
| 5,390,648 | * 2/1995 | Yanase | 124/634 |

* cited by examiner

Primary Examiner—Henry C. Yuan
Assistant Examiner—Mahmoud M Gimie
(74) Attorney, Agent, or Firm—Visteon GlobalTech. Inc

(57) ABSTRACT

There is disclosed herein an apparatus for routing electrical signals in an engine having n cylinders and an intake manifold, one embodiment of which comprises: (1) a generally rigid housing generally conforming in shape with and being removably attachable to a top surface of the intake manifold; (2) at least n carrier members attached to the housing and extending outward therefrom, wherein each carrier member is arranged in general proximity with a respective cylinder; (3) a plurality of conductive circuit traces arranged on or within an underside or other surface of the housing and on or within each carrier member; and (4) at least one input/output connector for connection to at least one of an external signal source, an external power source, an external signal destination, and an external power destination, wherein each input/output connector is attached to the housing and is electrically connected to at least one of the circuit traces. Each circuit trace carried by each carrier member terminates in a termination electrically connectable with an electrical engine element, such as an ignition coil, an electronic fuel injector, a spark plug, and/or a glow plug.

19 Claims, 5 Drawing Sheets

APPARATUS FOR ROUTING ELECTRICAL SIGNALS IN AN ENGINE

This application is a division of Ser. No. 08/999,077 filed Dec. 29, 1997.

BACKGROUND OF THE INVENTION

1. Field of the Invention

The present invention relates generally to engines having air induction systems, such as internal combustion engines. More particularly, the present invention relates to an apparatus for routing electrical signals in an engine having an air intake manifold.

2. Disclosure Information

Most engines, such as internal combustion engines, have an air intake manifold 50 for taking in air from outside the engine 30 and directing it into each engine cylinder, as illustrated in FIGS. 1–2. The outside air flows in through an air intake duct 56 into a central air chamber, from which it is then directed into individual runners or channels 54 and into each individual engine cylinder where combustion takes place.

Combustion is typically facilitated by activating a spark from a spark plug within the cylinder of a gasoline engine, or by activation of a glow plug within the cylinder of a diesel engine. Such activation is generally accomplished by supplying either pulsed or continuous electrical signals or power feeds to the spark plug or glow plug. These signals or power feeds in turn typically come from either a central distributor, or from individual ignition coils at each cylinder. In fuel injected engines, it may also be desirable to have an individual electronic fuel injector (EFI) disposed proximate each cylinder; these EFIs also require signals or power feeds, typically from a microprocessor-controlled subsystem.

The electrical distribution system required to facilitate these various signals and/or power feeds conventionally requires a considerable network of wires, cables, harnesses, connectors, fasteners, brackets, standoffs, strain reliefs, and one or more support frames for arranging, routing, and supporting all of these elements, as illustrated in FIGS. 1–2. In addition, most engines nowadays also require various other electrical engine sub-systems, such as engine control modules, mass air flow sensor modules, anti-lock brake control modules, and so forth. Each of these sub-systems also requires its associated wires, harnesses, connectors, housings, fasteners, etc., further adding to the electrical A=distribution and routing system of the engine. Although these various sub-systems are necessary, they may each add to the overall weight, space, complexity, and cost of the engine.

It would be desirable, therefore, to provide some means of accommodating the various signal and power feed needs of an engine system while reducing the overall overall weight, space requirements, cost, and complexity heretofore associated therewith.

SUMMARY OF THE INVENTION

The present invention overcomes the disadvantages of the prior art approaches by providing an apparatus for routing electrical signals in an engine having n cylinders and an intake manifold, one embodiment of which comprises: (1) a generally rigid housing generally conforming in shape with and being removably attachable to a top surface of the intake manifold; (2) at least n carrier members attached to the housing and extending outward therefrom, wherein each carrier member is arranged in general proximity with a respective cylinder; (3) a plurality of conductive circuit traces arranged on or beneath a surface of the housing and on or within each carrier member; and (4) at least one input/output connector for connection to at least one of an external signal source, an external power source, an external signal destination, and an external power destination, wherein each input/output connector is attached to the housing and is electrically connected to at least one of the circuit traces. Each circuit trace carried by each carrier member terminates in a termination electrically connectable with an electrical engine element, such as an ignition coil, an EFI, a spark plug, and/or a glow plug.

It is an object and advantage that the present invention may accommodate various signal and power needs of an engine electrical system while reducing the weight, space requirements, cost, and complexity otherwise associated therewith.

Another advantage is that the present invention may incorporate electronic components from one or more electrical sub-systems of an engine so as to provide even further overall reductions in weight, space requirements, cost, and complexity.

These and other advantages, features and objects of the invention will become apparent from the drawings, detailed description and claims which follow.

DETAILED DESCRIPTION OF THE PREFERRED EMBODIMENTS

Figure 2:
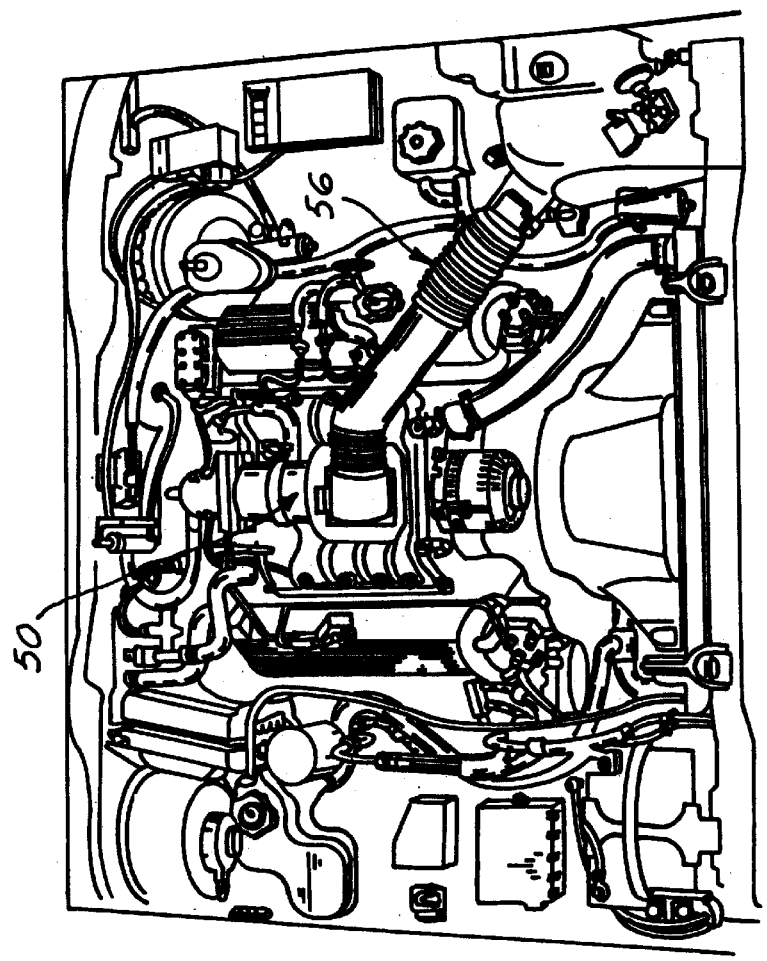
FIG. 2 is perspective view of another typical internal combustion engine and associated intake manifold.
Figure 1:
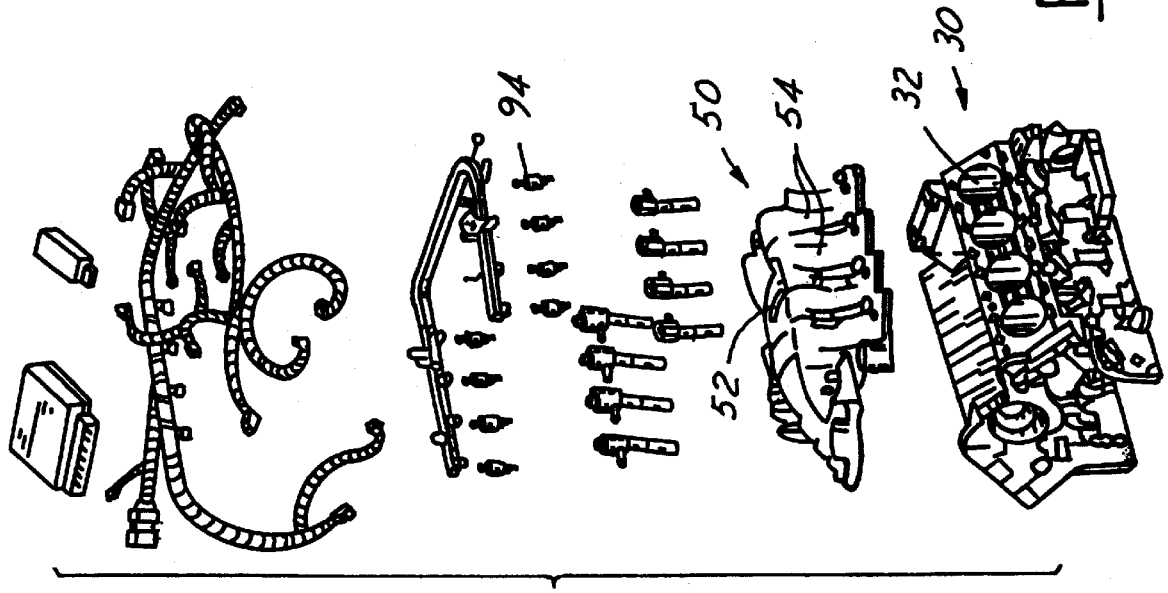
FIG. 1 is an exploded perspective view of a typical internal combustion engine and associated intake manifold.
Figure 3:
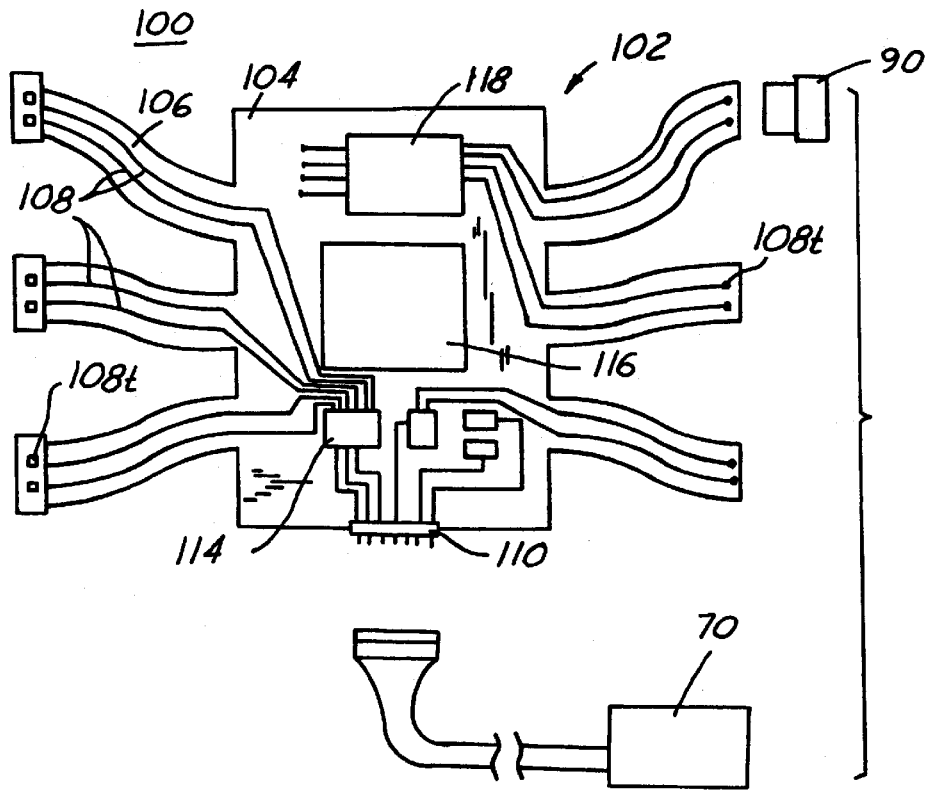
FIGS. 3–4 are top and perspective views, respectively, of a first embodiment of the present invention.
Figure 4:
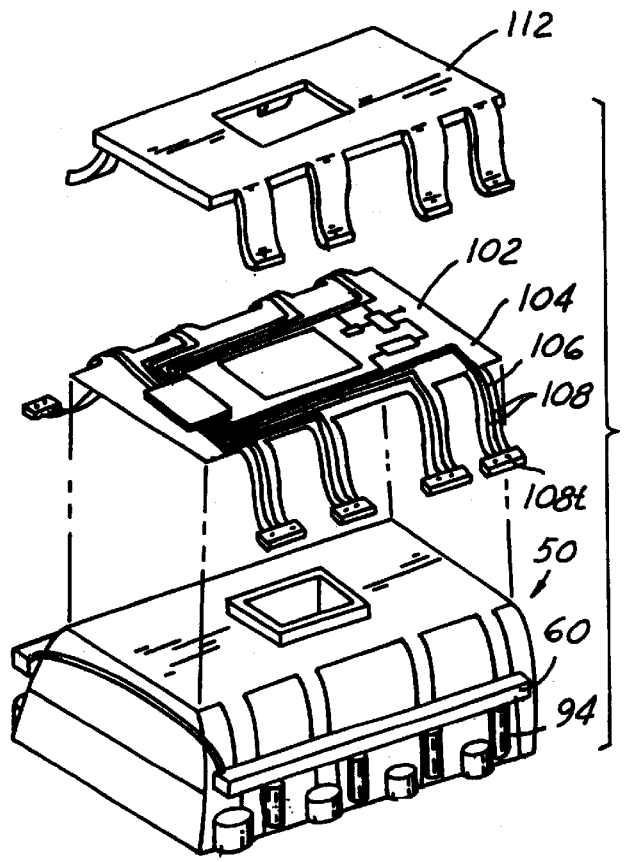

Referring now to the drawings, FIGS. 3–4 show a first embodiment 100 of the present invention, namely a flex circuit for routing electrical signals in an internal combustion engine 30 having n cylinders and an intake manifold 50. This embodiment comprises: (1) a flex circuit substrate 102 having a body portion 104 and at least n arm portions 106 extending outward from the body portion, wherein the body portion generally conforms in shape with a top surface 52 of the intake manifold 50, and wherein each arm portion is arranged in general proximity with a respective cylinder; (2) a plurality-of conductive circuit traces 108 arranged proximate (i.e., on or beneath/within) at least one surface of the body portion 104 and of each arm portion; and (3) at least one input/output connector 110 for connection to at least one of an external signal source, an external power source, an external signal destination, and an external power destination (collectively designated by reference numeral 70), wherein each input/output connector 110 is attached to the substrate 102 and is electrically connected to at least one of the circuit traces 108. In this embodiment, each circuit trace carried by each arm portion 106 terminates in a termination 108t capable of electrical connection with at least one electrical engine element 90, such as an ignition coil, an electronic fuel injector, a spark plug, and/or a glow plug.

The substrate 102 is preferably a substantially flexible substrate, such as a film, sheet, or lamination of polyetherimide, polyester, or other materials used to make flex circuits. Alternatively, the substrate 102 may comprise one or more metal foils or sheets with one or more layers of insulative, conductive, and/or dielectric material selectively applied thereto (e.g., by lamination, etching, or other additive or subtractive processes). Although the substrate 102 is preferably generally flexible, the body portion 104 may alternatively include at least one rigid substrate portion 118 (e.g., an FR-4 daughter board) operably connected to the remaining flexible body portion and/or arm portions. Likewise, the entire body portion 104 may comprise a rigid substrate, to which flexible substrate arm portions 106 are operably attached.

The substrate 102 may include a plurality of electronic components 114 operably attached to the circuit traces 108 thereon. These components 114 are preferably surface mount conponents, such as integrated circuit (IC) chips, leadless chip components (LCCS) such as resistors and capacitors, power devices, interconnect devices, and the like. It is possible to take components from otherwise separate electronic control modules—including but not limited to engine control modules, mass air flow sensor modules, anti-lock brake control modules, speed control modules, throttle control modules, fuse box modules, exhaust gas return (EGR) valve control modules, engine temperature sensor control modules—and integrate the components onto the flex substrate 102 of the present embodiment. This would provide the advantage of eliminating the various housings, wires, cables, harnesses, busses, interconnects, fasteners, etc. that are otherwise needed for each individual module and incorporating only the necessary parts therefrom (i.e., the electronic components) onto the flex substrate 102, thereby reducing cost, weight, space, and complexity for the overall engine system.

The substrate 102 may further include a hole 116 in the body portion 104 thereof, through which a top portion of the intake manifold 50 or an end portion of an air intake duct 56 may extend. The substrate 102 may also be removably attachable to the top surface 52 of the intake manifold 50. This may be done, for example, by providing holes in the substrate 102 through which fasteners may be inserted for holding the substrate against the manifold, or by providing fasteners integral with the substrate which directly attach to the manifold.

Figure 5:
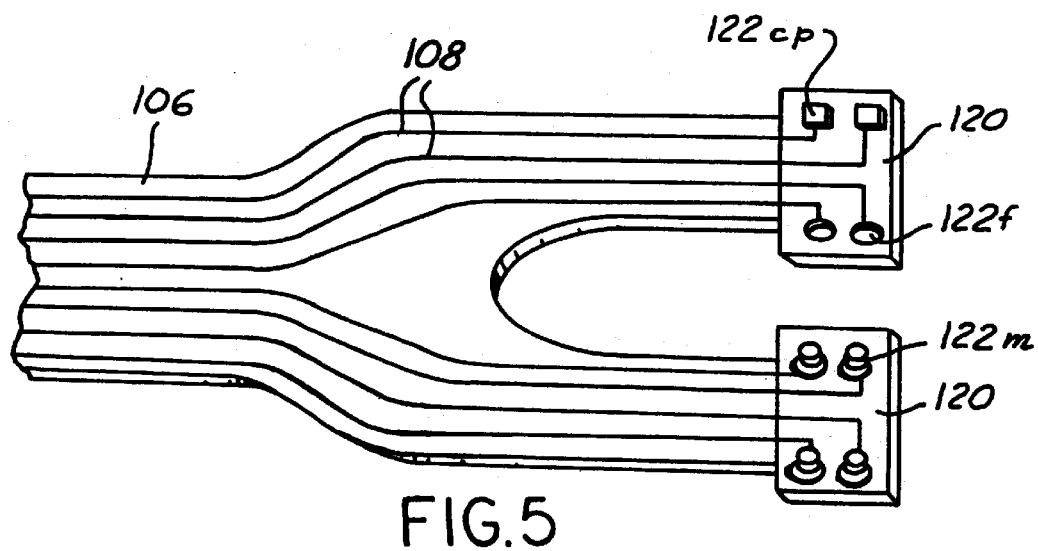
FIG. 5 is a top view of an arm portion and terminations according to a first embodiment of the present invention.

Each arm portion 106 may include a rigid substrate member 120 on an end thereof, wherein the termination of each circuit trace 108 on each arm portion 106 is disposed on the rigid substrate member 120, as illustrated in FIG. 5. Also, each circuit trace termination 108t on each arm portion 106 may comprise a male plug connector 122m, a female socket connector 122f, or a generally flat contact pad 122cp. These plug connectors 122m/122f may optionally be attached to or made integral with the rigid substrate member 120 on the end of each arm portion 106.

The conductive circuit traces 108 may be similar to those found on conventional rigid PCBs and flex circuits, such as the metallizations or paths of copper or conductive ink applied to one or both planar sides of such substrates. The traces 108 may also comprise wires or other electrical conductors applied to a surface of the substrate 102, or which are embedded, molded, or otherwise placed beneath a surface of the substrate (i.e., within the substrate).

The input/output (I/O) connector 110 is used to connect one or more substrate circuit trace(s) 108 (typically multiple traces) to one or more external electrical elements 70. From the perspective of current flow within the engine's electrical system, these external elements 70 may each be an "upstream" source or a "downstream" destination (or both) with respect to the I/O connector 110. The electrical flow to or from each of these external elements to which the I/O connector is connected may be generally designated as "signal" strength (e.g., milliamps, millivolts) or "power" strength (e.g., 1+ amps, 1+ volts). Thus, an external "power source" might be a 12-volt battery, a "power destination" might be a solenoid requiring several amps/volts to actuate, a "signal source" might be a 150-millivolt output from a microprocessor, and a "signal destination" might be a 150-millivolt input to the same microprocessor. Furthermore, it should be understood that the electrical flow into and out of the I/O connector 110 may at any time be continuous, intermittent/pulsed, or both. The I/O connector 110 itself may assume any of the multitude of different I/O connector configurations known in the art which can be operably connected to a flexible, semi-rigid/rigiflex, or rigid substrate 102.

The present embodiment may also include a cover 112 capable of covering substantially all of the body portion 104 and at least part of each arm portion 106, as shown in FIG. 4. This cover 112 may be made out of plastic, metal, fiberglass, and the like (or combinations thereof), may be removably attachable to the intake manifold 50, and serves as a protective covering for the underlying substrate, traces, etc. The cover 112 may include a generally sealable hole therein through which the top portion of the manifold or an end portion of the air intake duct may extend.

In its most basic form, the present embodiment 100 may be used to replace the wires, cables, harnesses, support frame(s), and other related elements used in conventional engine systems for routing and distributing electrical signals to the engine's ignition coils, EFIs, spark plugs, glow plugs, and/or other electrical engine elements 90, thus reducing cost, space, weight, and complexity for the overall engine system. By further including the electronic components from one or more engine control modules as described above, further reductions can be realized.

Moreover, the savings and reductions made possible by the present invention relate not only to the-initial manufacturing and assembly of the engine system, but also to the maintenance and service life of the engine system as well. As an example of how the present embodiment might be used, the flex circuit 100 might contain electronic components and interconnections such that the flex circuit 100 may (1) take in signal and power from various external sources (e.g., a battery output, a microprocessor output, a switch output) via the I/O connector 110, (2) process and/or re-route the signal/power within the flex circuit itself, and then (3) send out signal/power feeds through both the I/O connector 110 and the arm portion circuit traces to various external signal/power destinations (e.g., microprocessor inputs, solenoid inputs, electric motor contacts, spark plugs, ignition coils, glow plugs, EFIs, etc.).

Figure 6A:
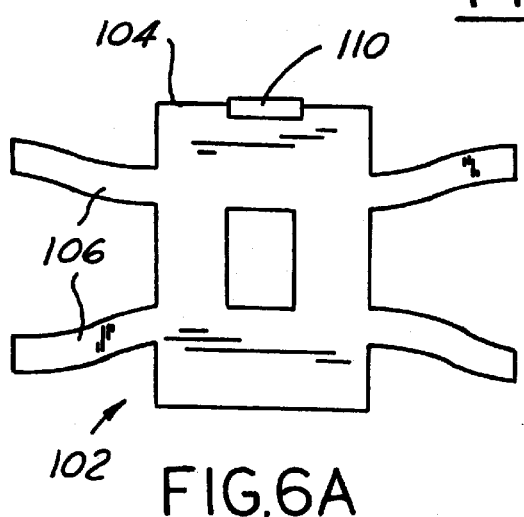
FIGS. 6A–C are top views of three possible configurations of a first embodiment of the present invention.
Figure 6B:
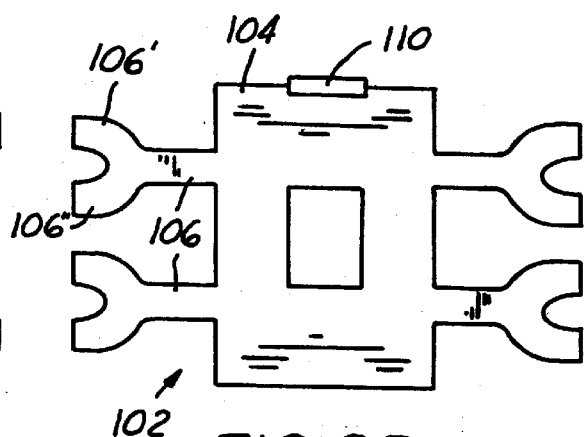
Figure 6C:
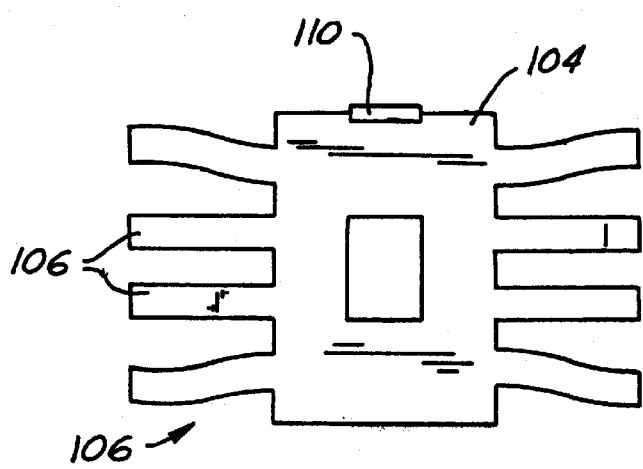

Many possible configurations exist for the present embodiment, as illustrated in FIGS. 6A–C for an engine having four cylinders (i.e., n=4). In a first example, as shown in FIG. 6A, the substrate 102 may have exactly n arm portions 106 (i.e., one for each cylinder) wherein the circuit traces (not shown) on or within each arm portion 106 have terminations capable of electrical connection with an ignition coil, an EFI, a spark plug, and/or a glow plug associated with the respective cylinder of each arm portion 106. Here, each arm portion 106 may generally conform in shape with a top runner surface 54 associated with the respective cylinder; the arm portions may then be laid atop (and optionally attached to) their respective runners and covered with a cover 112 corresponding in overall shape with the body and arm portions 104/106 as laid out atop the manifold 52 and runners 54. In a second example, as shown in FIG. 6B, the substrate 102 may have exactly n arm portions 106 with each dividing further into first and second branches 106'/106". In this case, circuit traces (not shown) on or within each first branch 106' have terminations (e.g., male plug connectors or female socket connectors) capable of electrical connection with an ignition coil, while circuit traces on or within each second branch 106" have terminations capable of electrical connection with an EFI. In a third example, as shown in FIG. 6C, the substrate 102 has 2n arm portions 106, wherein circuit traces proximate each arm portion 106 have terminations electrically connectable with one of an ignition coil, an EFI, a spark plug, and a glow plug. Many other configurations are also possible within the scope of the present invention. In any case, generally, the flex circuit substrate 102 may be draped and optionally attached onto the top surface 52 of the manifold 50, and a cover 112 as described above may then be placed over the flex circuit 102 and attached to the manifold 50.

A second embodiment of the present invention relates to an intake manifold cover 200 for routing electrical signals in an internal combustion engine 30 having n cylinders and an intake manifold 50, as shown in FIGS. 3–9. This embodiment comprises: (1) a generally rigid housing 230 generally conforming in shape with and being removably attachable to a top surface 52 of the intake manifold 50; (2) at least n carrier members 240 attached to the housing 230 and extending outward therefrom, wherein each carrier member is arranged in general proximity with a respective cylinder; (3) a plurality of conductive circuit traces 208 arranged on or beneath a surface 232 of the housing 230 and on or within each carrier member 240; and (4) at least one input/output connector 210 for connection to at least one of an external signal source, an external power source, an external signal destination, and an external power destination (designated collectively by reference numeral 70), wherein each input/output connector 210 is attached to the housing 230 and is electrically connected to at least one of the circuit traces 208. In this embodiment 200, each circuit trace 208 carried by each carrier member 240 terminates in a termination 208t capable of electrical connection with at least one electrical engine element 90, such as an ignition coil, an EFI, a spark plug, and/or a glow plug.

This embodiment 200 combines many of the features of the flex substrate 102 and cover 112 of the first embodiment 100, but is not a mere combination of these two elements. For example, whereas the first embodiment 100 includes a flex circuit substrate 102, the present embodiment 200 does not necessarily include a flex substrate. Instead, the traces 208 (and optional electronic components 214 operably connected thereto) of the present embodiment 200 may be directly connected to a surface 232 (preferably an underside surface) of the housing 230, thereby eliminating the need for a flex substrate. Of course, a flex substrate (and/or even a rigid substrate or substrate portion) may be included if desired; for example, the traces 208 and optional electronic components 214 may be attached to a flex circuit substrate, with this substrate then being attached to the underside or other surface 232 of the housing 230, or a flex circuit substrate may first be attached to the underside or other surface 232 and then the traces/components 208/214 attached thereto.

The generally rigid housing 230 may be (and preferably is) somewhat flexible. It is described as being "generally" rigid in that it should be able to generally maintain its shape when being handled (e.g., during manufacture and installation), but should have some inherent flexibility, as is the case with most thermoformed plastic parts, for example.

Figure 7:
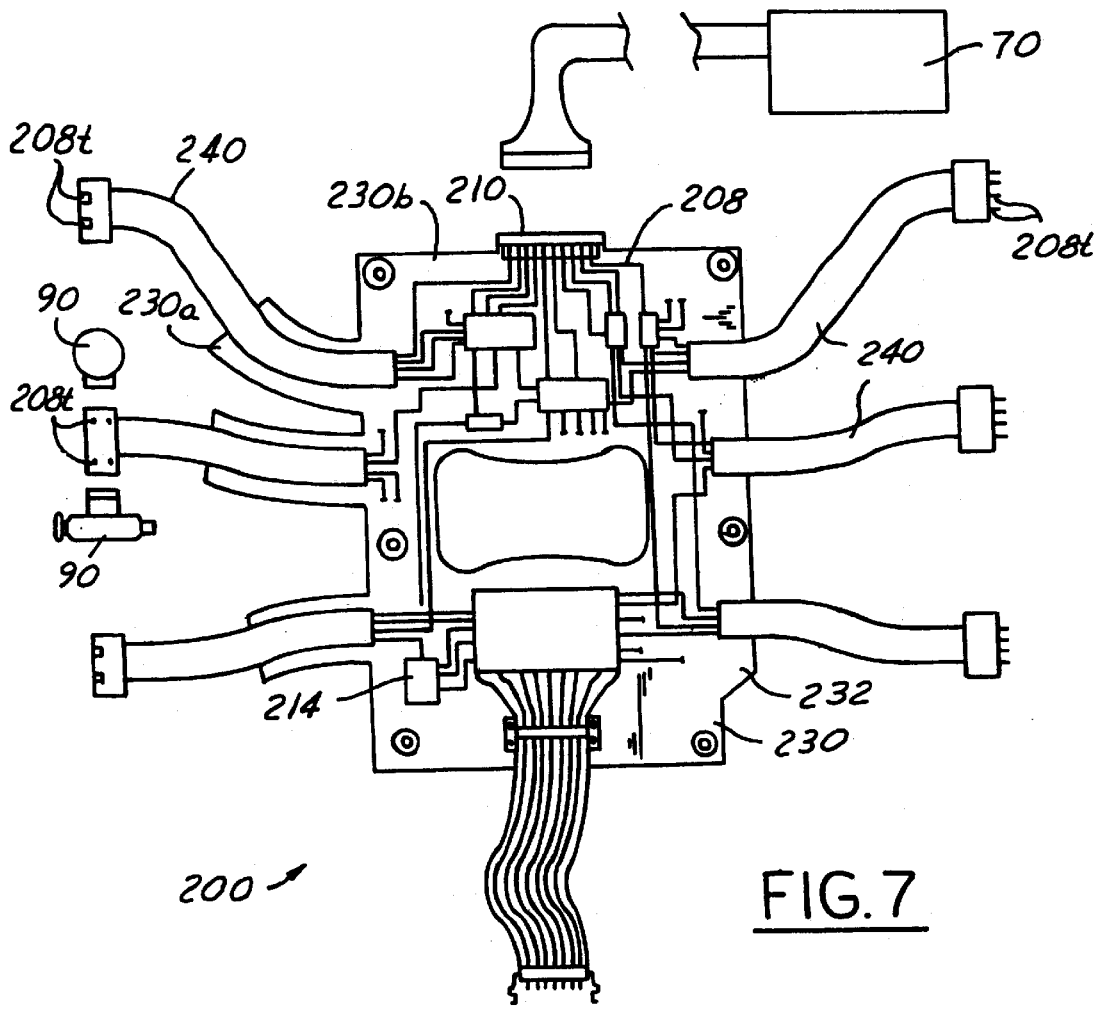
FIGS. 7–9 are top views of a second embodiment of the present invention.

Like the first embodiment, the present embodiment 200 may assume many different but related configurations. For example, as shown in FIG. 7, each carrier member 240 may be an electrically insulative flexible substrate which carries the one or more circuit traces 208 thereon or therein. The flex substrate material in this case may be a flexible elastomer, such as silicone, or may be made of polyester, polyetherimide, or other suitable materials. These carrier members 240 may be attached to a lateral edge and/or to an underside or other surface of the housing 230 by adhesives, mechanical fasteners, in-molding, etc., and serve to carry signal/power between at least the I/O connector 210 and an electrical engine element 90 such as an ignition coil, EFI, spark plug, and/or glow plug. For example, each carrier member 240 may serve to carry signals/power from the I/O 210 and/or optional electronics 214 to an ignition coil and/or an EFI associated with the carrier member's respective cylinder.

Figure 8:
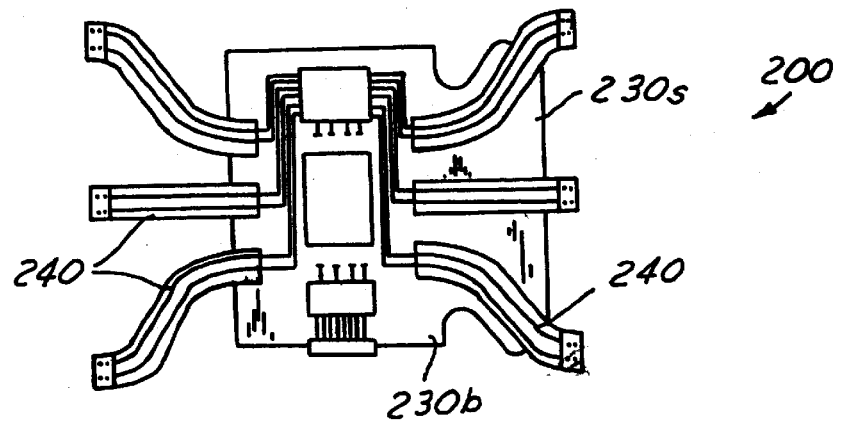

The housing 230 may comprise a body portion 230b and at least n arm portions 230a extending outward from the body portion, wherein the body portion generally conforms in shape with the top surface 52 of the manifold 50, and wherein each arm portion 230a is arranged in general proximity with a respective cylinder, as shown on the left-hand side of the cover shown in FIG. 8. Alternatively, the housing 230 may comprise a body portion 230b as just described and at least one shroud portion 230s extending outward from the body portion on one or both lateral edges of the body portion, as shown on the right-hand side of the cover shown in FIG. 8. In either of these two housing configurations, the arm portions/shroud portions 230a/230s are preferably made integral with the body portion 230s, thus constituting a single piece which can be easily molded. In these two configurations each carrier member 240 is preferably attached to a corresponding arm portion 230a or shroud portion 230s, but may alternatively be attached to the body portion 230b.

Figure 9:
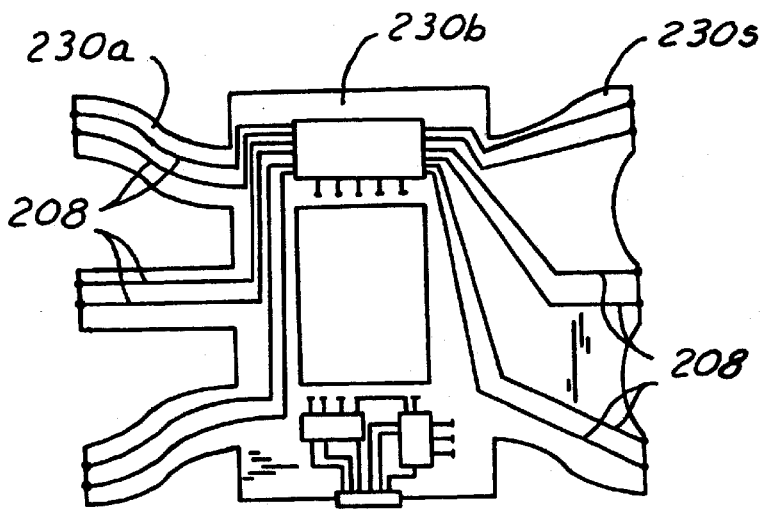

Each carrier member 240 and/or (if provided) each arm portion 230a made be constructed so as to generally conform in shape with a top runner surface associated with the respective cylinder thereof. Alternatively, rather than providing separate but geometrically similar arm portions 230a and carrier members 240, the features of both may be combined to comprise a configuration wherein each carrier member 240 is an outwardly extending integral arm portion of the housing 230. That is, rather than having carrier members which carry circuit traces thereon or therein attached to separate, corresponding arm portions 230a or shroud portions 230s, instead the circuit traces could be carried on or within an underside (or other) surface of each arm or shroud portion 230a/230s—each arm/shroud portion would both extend outward from the body portion 230b and serve as a carrier for the circuit traces 208 associated with the arm portion and respective cylinder, as illustrated in FIG. 9.

Figure 10:
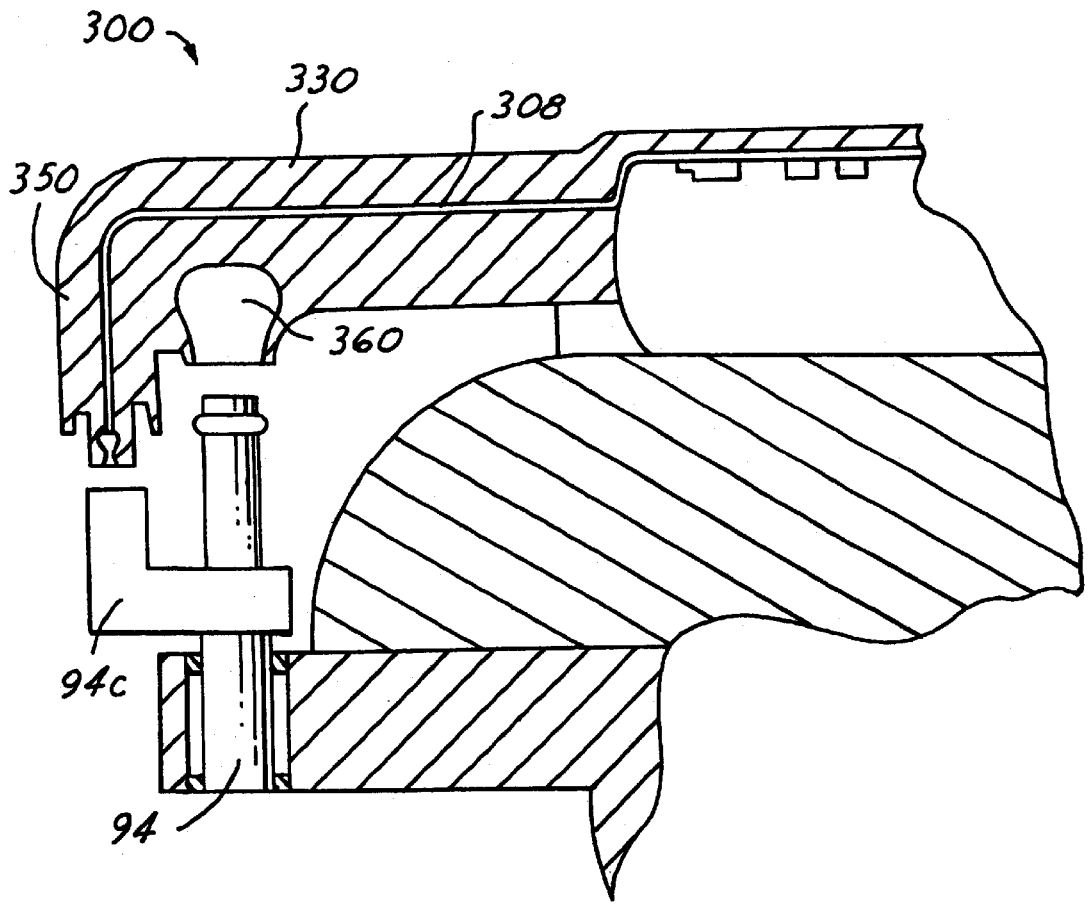
FIG. 10 is a sectional side view of a third embodiment of the present invention.

A third embodiment of the present invention is illustrated in FIG. 10, and comprises: (1) a generally rigid housing 330 generally conforming in shape with and being removably attachable to a top surface 52 of the intake manifold, the housing 330 extending generally over each cylinder; (2) a plurality of conductive circuit traces 308 arranged on or within an underside or other surface of the housing and extending in general proximity with each cylinder; (3) at least one input/output connector for connection to at least one of an external signal source, an external power source, an external signal destination, and an external power destination, wherein each input/output connector is attached to the housing 330 and is electrically connected to at least one of the circuit traces 308; and (4) at least n electrical connectors 350 in-molded in the housing 330, wherein each connector 350 is connected with at least one of the circuit traces 308 and is disposed within the housing 330 so as to be directly connectable with an electrical engine element 90 when the housing 330 is attached to the intake manifold 50. The housing portion(s) which extend over each cylinder may comprise integral arm or shroud portions, similar to FIG. 9.

As shown in FIG. 10, the intake manifold cover 300 may further comprise at least one fuel rail 360 integral with the housing 330, wherein each fuel rail is directly and sealably connectable with at least one electronic fuel injector 94 so as to provide sealable fluid communication between the fuel rail and each EFI connectable thereto. Preferably, the cover 330 is made of molded plastic and includes either one fuel rail 360 for slant-type or in-line engines or two fuel rails 360 for V-type engines. The fuel rail(s) 360 may be conventional metal fuel rails that are insert molded into the housing 330, or (as shown in FIG. 10) may be metallized or non-metallized channels formed within the housing 330 by lost-core or other molding processes.

The cover 300 of the present embodiment may include n electrical connectors 350 disposed within the housing 330. Each connector 350 is directly connectable with a mating electrical connector portion 94c of a respective electronic fuel injector 94 when the housing 330 is placed atop and attached to the intake manifold 50.

At least a subset of the circuit traces 308 may be in-molded within the housing 330 and may comprise a metal stamping, a flex circuit, or a network of wires within the housing. Preferably this subset of traces are each operably connected with the at least n electrical connectors 350.

One advantage of the present embodiment is that the cover 300 may be fitted over and attached to the manifold 50 with the aforementioned electrical connectors 350 fitting directly atop their respective electrical engine elements 90. For example, a cover may have connectors 350 in-molded therein which may simultaneously mate directly with the mating electrical connector portions of n ignition coils and n fuel injectors when the cover is lowered onto and attached to the manifold 50, without requiring additional steps or interconnecting components (e.g., wire harnesses or cables) for connecting the coils and EFIs with their power/signal sources. Adding the fuel rails 360 as described above further reduces complexity and installation effort.

Various other modifications to the present invention will, no doubt, occur to those skilled in the art to which the present invention pertains. For example, although only V-type engines are shown in the drawings, the present invention also relates to slant-type engines, in-line engines, rotary engines, etc. It should also be understood that the present invention relates to both gasoline and diesel internal combustion engines, as well as to hybrid electric/internal combustion engines. The present invention applies to engines using spark plugs, glow plugs, or compression-ignition-only; to those having carburetors, EFIs, or other related systems; and to those having central distributors, coil-on-plug, and other related spark activation systems. Furthermore, while the arm portions, shroud portions, and carrier members have been described above as being connected to or integral with a cover, housing, or body portion, it is within the scope of the present invention that the arm portions, shroud portions, and carrier members may be removably connectable with their associated cover, housing, or body portion, such as by using mating male/female electrical connectors. Also, the housing or cover may include louvers, vanes, and the like for directing some amount of air from the air intake duct across the circuit traces and optional electronic components, so as to assist in cooling these elements during operation. Also, although in the drawings the intake manifold is shown (for simplicity) sitting essentially within the confines of the top surface of the engine, the manifold may include portions extending beyond the top surface of the engine, such as an air intake tube, a throttle body housing, etc. Moreover, it should be understood that while the arm portions and carrier members have variously been described as being connected to ignition coils, EFIs, spark plugs, and glow plugs, it is contemplated that other electrical engine elements may be used instead of or in addition to these four highlighted elements, such as engine sensors, climate sensors, solenoids, switches, etc., whether sending or receiving signals to or from the present invention. Additionally, it should be understood that the use of the word "signal" as variously used herein may encompass both relatively low voltage/low amperage triggering signals and relatively high voltage/high amperage power feeds, whether sent/received in intermittent pulses or in continuous non-pulsed form. Finally, the present invention further includes a flex circuit similar to the first embodiment, but which has no arm portions, or less than n arm portions, and which may not necessarily include any element which is generally proximate to or related with any engine cylinder. It is the following claims, including all equivalents, which define the scope of the present invention.

What is claimed is:

1. An intake manifold cover for routing electrical signals in an internal combustion engine having n cylinders and an intake manifold, comprising:

a generally rigid housing generally conforming in shape with and being removably attachable to a top surface of the intake manifold, said housing extending generally over each cylinder;

a plurality of conductive circuit traces arranged on or within a surface of said housing and extending in general proximity with each cylinder;

at least one input/output connector for connection to at least one of an external signal source, an external power source, an external signal destination, and an external power destination, wherein each input/output connector is attached to said housing and is electrically connected to at least one of said circuit traces;

at least n electrical connectors in-molded in said housing, wherein each connector is connected with at least one of said circuit traces and is disposed within said housing so as to be directly connectable with an electrical engine element when said housing is attached to the intake manifold.

2. An intake manifold cover according to claim 1, wherein said electrical engine element is one of an ignition coil, an electronic fuel injector, a spark plug, and a glow plug.

3. An intake manifold cover according to claim 1, further comprising at least one fuel rail integral with said housing, wherein each fuel rail is directly and sealably connectable with at least one electronic fuel injector so as to provide sealable fluid communication between said each fuel rail and each electronic fuel injector connectable thereto.

4. An intake manifold cover according to claim 3, wherein said at least n electrical connectors include n electrical connectors disposed within said housing such that each is directly connectable with a mating electrical connector portion of a respective electronic fuel injector when said housing is attached to the intake manifold.

5. An intake manifold cover according to claim 1, wherein said housing is generally made of molded plastic.

6. An intake manifold cover according to claim 1, wherein at least a subset of said circuit traces are in-molded within said housing and comprise one of a metal stamping, a flex circuit, and a network of wires.

7. An intake manifold cover according to claim 6, wherein said subset of circuit traces are operably connected with said at least n electrical connectors.

8. A cover for use with an engine of the type having an intake manifold, a plurality of cylinders and a plurality of fuel injectors, said cover comprising:

a generally rigid housing which is selectively attachable to a top surface of said intake manifold and which extends generally over each of said plurality of cylinders; and at least one fuel rail which is integral with said housing and which is sealably connected with at least one of said plurality of fuel injectors, thereby allowing fuel to be fluidly communicated to said at least one of said plurality of fuel injectors.

9. The cover of claim 8 wherein said at least one fuel rail comprises at least one-metal rail which is insert molded into said housing.

10. The cover of claim 8 wherein said at least one fuel rail comprises at least one metallized channel which is formed within said housing.

11. The cover of claim 8 wherein said at least one fuel rail comprises at least one non-metallized channel which is formed within said housing.

12. The cover of claim 8 further comprising:

a plurality of conductive traces which are disposed within said housing and which extend in general proximity to said plurality of cylinders, each of said plurality of conductive traces being connectable to a unique one of said plurality of fuel injectors; and at least one first electrical connector which is connected to said housing and to at least one of said plurality of conductive traces and which cooperates with said at least one of said plurality of conductive traces to allow electrical signals to be communicated to at least one of said plurality of fuel injectors.

13. A manifold cover for use with an engine of the type having a plurality of cylinders and an intake manifold, said manifold cover comprising:

a housing having a shape which conforms with said intake manifold, said housing being removably attached to said intake manifold and generally extending over each of said plurality of cylinders;

a plurality of conductive traces which are disposed upon an underside of said housing, each of said plurality of conductive traces extending in general proximity to a unique one of said plurality of cylinders;

at least one first electrical connector which is connected to said housing and to at least one of said plurality of conductive traces and which allows at least one of said plurality of conductive traces to be selectively connected to at least one external electrical component; and a plurality of second electrical connectors which are operatively disposed within said housing, each of said second electrical connectors being connected to at least one of said plurality of conductive traces, each of said plurality of second electrical connectors being further connectable to an electrical engine element when said housing is attached to said intake manifold.

14. The manifold cover of claim 13 wherein said housing is generally rigid.

15. The manifold cover of claim 13 wherein said plurality of second electrical connectors are in-molded within said housing.

16. The manifold cover of claim 13 wherein said at least one electrical component comprises at least one of an external signal source, an external power source, an external signal destination and an external power destination.

17. The manifold cover of claim 13 wherein said electrical engine element comprises one of an electronic fuel injector, a spark plug and a glow plug.

18. The manifold cover of claim 13 further comprising at least one fuel rail which is operatively disposed within said housing and which is sealably connected with at least one electronic fuel injector and which is effective to allow fuel to be fluidly communicated to said at least one electronic fuel injector.

19. The manifold cover of claim 18 wherein said at least one fuel rail comprises one of a metal rail which is insert molded into said housing, a metallized channel which is formed within said housing and a non-metallized channel which is formed within said housing.

* * * * *